(12) United States Patent
Sugihara et al.

(10) Patent No.: US 8,553,908 B2
(45) Date of Patent: Oct. 8, 2013

(54) AMPLIFICATION APPARATUS

(75) Inventors: Shogo Sugihara, Neyagawa (JP);
Tadaharu Sunaga, Neyagawa (JP);
Norio Etoh, Neyagawa (JP)

(73) Assignee: Onkyo Corporation, Neyagawa-shi (JP)

( * ) Notice: Subject to any disclaimer, the term of this patent is extended or adjusted under 35 U.S.C. 154(b) by 400 days.

(21) Appl. No.: 12/883,296

(22) Filed: Sep. 16, 2010

(65) Prior Publication Data

US 2011/0170713 A1    Jul. 14, 2011

(30) Foreign Application Priority Data

Jan. 14, 2010  (JP) ................. 2010-005977
Aug. 31, 2010  (JP) ................. 2010-193047

(51) Int. Cl.
*H03G 3/00*    (2006.01)
*H03F 99/00*   (2009.01)
*H03G 3/20*    (2006.01)

(52) U.S. Cl.
USPC ........... 381/107; 381/120; 381/121; 381/104; 381/57; 330/51

(58) Field of Classification Search
USPC ............... 381/104, 107, 108, 109, 120, 121, 381/57; 330/51, 127
See application file for complete search history.

(56) References Cited

U.S. PATENT DOCUMENTS 6,785,392 B1 *  8/2004  Llewellyn ............ 381/120
7,394,312 B2 *  7/2008  Schoenberger .......... 330/51

FOREIGN PATENT DOCUMENTS

| JP | 54-028512   | 3/1979  |
|----|-------------|---------|
| JP | 62-188598   | 8/1987  |
| JP | 3-2722      | 1/1991  |
| JP | 03-134842   | 6/1991  |
| JP | 07-226633   | 8/1995  |
| JP | 08-242124   | 9/1996  |
| JP | 8-242124    | 9/1996  |
| JP | 10-301757   | 11/1998 |
| JP | 2000-354219 | 12/2000 |
| JP | 2003-087684 | 3/2003  |
| JP | 2003-174331 | 6/2003  |
| JP | 2008-118825 | 5/2008  |

OTHER PUBLICATIONS

Rod Elliott: "Signal Detecting Auto Power-On Unit"; Dec. 5, 1999, XP002660750, Retrieved from the Internet: URL:http://sound.westhost.com/project38.htm (retrieved on Oct. 7, 2011). Last chapter "Speaker Signal Powering."

* cited by examiner

*Primary Examiner* — Vivian Chin
*Assistant Examiner* — Ammar Hamid
(74) *Attorney, Agent, or Firm* — Renner, Otto, Boisselle & Sklar, LLP

(57) ABSTRACT

An amplification apparatus comprises: an amplifier circuit that amplifies an input audio signal and outputs an output audio signal; a first signal level determining unit that determines whether or not a signal level of the output audio signal outputted from the amplifier circuit is lower than a silence determination reference value; and a power-supply control unit that shifts the amplification apparatus from a power-on state to a power-off state, when it is determined that the signal level of the output audio signal outputted from the amplifier circuit is lower than the silence determination reference value.

8 Claims, 11 Drawing Sheets

FIG. 6

| VOLUME VALUE | SILENCE DETERMINATION REFERENCE VALUE |
|:---:|:---:|
| 0 | 0.0001 |
| 1 | 0.0002 |
| 2 | 0.0002 |
| 3 | 0.0003 |
| 4 | 0.0003 |
| ... | ... |
| 97 | 0.0097 |
| 98 | 0.0098 |
| 99 | 0.0099 |
| 100 | 0.01 |

AMPLIFICATION APPARATUS

BACKGROUND OF THE INVENTION

1. Field of the Invention

The present invention relates to an amplification apparatus that reduces power consumption during silence.

2. Description of the Related Art

In Japanese Patent Application Laid-Open No. 7-226633, there is described a technique of detecting an output signal of an amplifier and driving a fan to cool the amplifier when the output signal of the amplifier is high, thereby protecting the amplifier. In Japanese Patent Application Laid-Open No. 2008-118825, there is described a technique of detecting an output signal of an amplifier and switching a power-supply voltage supplied to the amplifier from a high voltage to a low voltage to protect the amplifier, when the output signal of the amplifier is high.

Moreover, in Japanese Patent Application Laid-Open No. 8-242124, there is described a technique of putting a power-supply voltage supplied to the amplifier into an off state when an audio signal inputted to am amplifier is lower than a reference voltage, thereby reducing power consumption during silence. According to this technique, a detection circuit that detects the presence or absence of the audio signal inputted to the amplifier needs to be provided between an audio input terminal and the amplifier, which disadvantageously increases a circuit size, thereby increasing a cost. In the case of an AV amplifier including a plurality of audio input terminals, a detection circuit that detects the presence or absence of the audio signal for each of the plurality of audio input terminals needs to be provided, which further increases the circuit size, thereby further increasing the cost.

SUMMARY OF THE INVENTION

An object of the present invention is to provide an amplification apparatus capable of reducing power consumption when the amplification apparatus is not used without providing a detection circuit that detects the presence or absence of an input audio signal between an audio input terminal and an amplifier circuit.

An amplification apparatus according to the present invention comprises; an amplifier circuit that amplifies an input audio signal and outputs an output audio signal; a first signal level determining unit that determines whether or not a signal level of the output audio signal outputted from the amplifier circuit is lower than a silence determination reference value; and a power-supply control unit that shifts the amplification apparatus from a power-on state to a power-off state, when it is determined that the signal level of the output audio signal outputted from the amplifier circuit is lower than the silence determination reference value.

Since whether or not the amplification apparatus is in a silent state is determined by detecting the signal level of the output audio signal of the amplifier circuit, the detection circuit that detects the presence or absence of the input audio signal between the audio input terminal and the amplifier circuit does not need to be provided. Accordingly, since even when the amplification apparatus includes the plurality of audio input terminals, the detection circuit does not need to be provided for each of the audio input terminals, a circuit size can be made smaller, thereby reducing a cost.

In the preferred embodiment of the present invention, the first signal level determining unit determines whether or not a state where the signal level of the output audio signal outputted from the amplifier circuit is lower than the silence determination reference value has lasted in a predetermined time period or more, and when it is determined that the state where the signal level of the output audio signal outputted from the amplifier circuit is lower than the silence determination reference value has lasted in the predetermined time period or more, the power-supply control unit shifts the amplification apparatus from the power-on state to the power-off state.

In the preferred embodiment of the present invention, the amplification apparatus further comprises: a second signal level determining unit that determines whether or not the signal level of the output audio signal outputted from the amplifier circuit is an amplifier protection reference value or higher; and an amplifier protecting unit that executes processing for protecting the amplifier circuit, when it is determined that the signal level of the output audio signal outputted from the amplifier circuit is the amplifier protection reference value or higher.

In this case, a signal level detecting unit for the amplifier protecting unit and a signal level detecting unit for the power-supply control unit are shared. Accordingly, when the amplifier protecting unit is provided, the signal level detecting unit for the power supply control unit does not need to be provided separately, which can make the circuit size smaller, thereby reducing the cost.

In the preferred embodiment of the present invention, the amplification apparatus further comprises: a volume adjusting unit that adjusts a signal level of the input audio signal in accordance with a set volume value to supply to the amplifier circuit; a volume value setting unit that sets the volume value of the volume adjusting unit in accordance with a user operation; a silence determination reference value managing unit that manages the volume value and the silence determination reference value in advance while associating them with each other; and a silence determination reference value deciding unit that reads the silence determination reference value corresponding to the volume value set by the volume value setting unit from the silence determination reference value managing unit to decide as the silence determination reference value.

In the preferred embodiment of the present invention, the silence determination reference value managing unit manages the volume value and the silence determination reference value while associating them with each other so that as the volume value becomes larger, the silence determination reference value becomes larger.

Since even when the volume value is set large, and the signal level of the noise signal is amplified to be high, the silence determination reference value is set large as well, the noise signal is prevented from becoming the silence determination reference value or higher in the silent state. As a result, the silent state can be precisely. Moreover, since when the volume value is set small, the silence determination reference value is also set small, erroneous determination of the silence when the signal level of the audio signal is low can be prevented.

In the preferred embodiment of the present invention, the input audio signal includes input audio signals of a plurality of channels, the first signal level determining unit determines whether or not a signal level of a synthesized signal of output audio signals of the plurality of channels outputted from the amplifier circuit is lower than the silence determination reference value, and when it is determined that the signal level of the synthesized signal of the output audio signals of the plurality of channels outputted from the amplifier circuit is lower than the silence determination reference value, the power-supply control unit shifts the amplification apparatus from the power-on state to the power-off state.

In this case, the signal level detecting unit does not need to be provided for each of the channels, which can make the circuit size smaller.

BRIEF DESCRIPTION OF THE DRAWINGS

FIG. 6 is a diagram showing a silence determination reference value table.

DETAILED DESCRIPTION OF THE PREFERRED EMBODIMENTS

Figure 1:
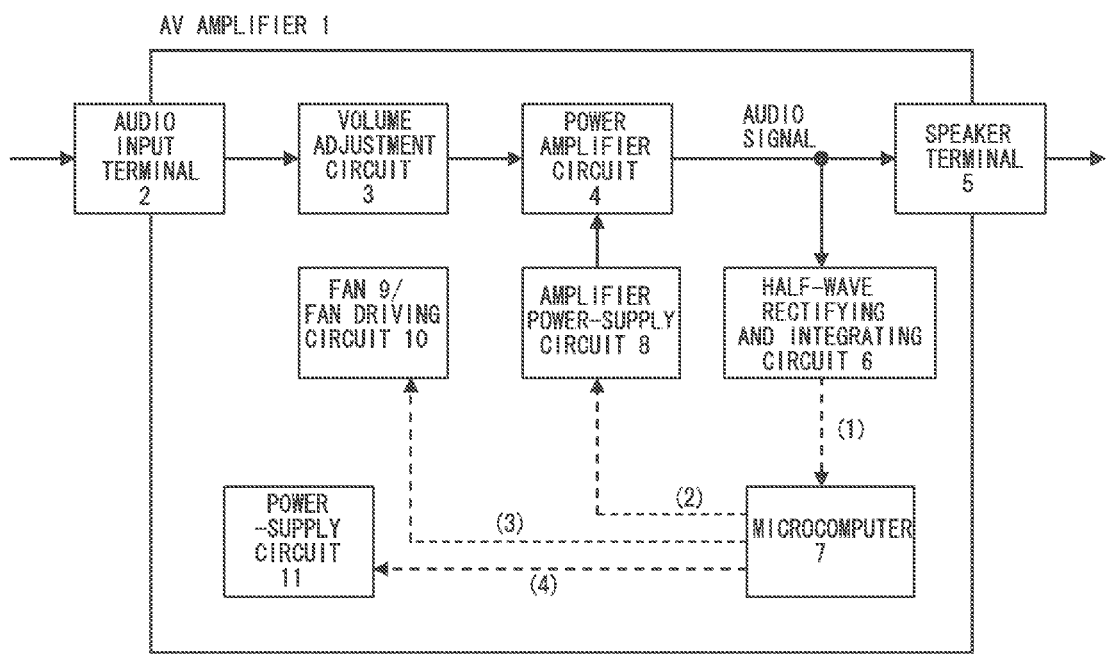
FIG. 1 is a block diagram showing an AV amplifier 1 according to a preferred embodiment of the present invention.

While hereinafter, preferred embodiments of the present invention are specifically described with reference to the drawings, the present invention is not limited to these embodiments. FIG. 1 is a block diagram showing an AV amplifier 1 according to the preferred embodiment of the present invention. The AV amplifier 1 includes an audio input terminal 2, a volume adjustment circuit 3, a power amplifier circuit 4, a speaker terminal 5, a half-wave rectifying and integrating circuit 6, a microcomputer 7, an amplifier power-supply circuit 8, a fan 9, a fan driving circuit 10, and a power-supply circuit 11.

To the audio input terminal 2, a CD player or the like can be connected, and an audio signal is inputted from the CD player, so that the inputted audio signal is supplied to the volume adjustment circuit 3. In fact, the AV amplifier 1 includes the plurality of audio input terminals 2 and a selector circuit, and the audio signal selected by the selector circuit and inputted to the audio input terminal 2 is supplied to the volume adjustment circuit 3. The volume adjustment circuit 3 adjusts a volume value of the audio signal supplied from the audio input terminal 2 to supply to the power amplifier circuit 4. The power amplifier circuit 4 amplifies the audio signal from the volume adjustment circuit 3 to supply the audio signal to a speaker connected to outside through the speaker terminal 5.

The half-wave rectifying and integrating circuit 6, the microcomputer 7, the amplifier power-supply circuit 8, the fan 9 and the fan driving circuit 10 make up an amplifier protecting circuit. The amplifier protecting circuit prevents a signal level (an amplitude value) of the output audio signal from the power amplifier circuit 4 from becoming extremely high, thereby damaging the power amplifier circuit 4 (particularly, an IC, a transistor and the like) due to heat, overvoltage, overcurrent or the like.

The half-wave rectifying and integrating circuit 6 is supplied with the output audio signal from the power amplifier circuit 4, and converts the output audio signal from the power amplifier 4 whose signal level wildly varies to an audio signal whose signal level varies smoothly so as enough to be detected by the microcomputer 7, and supplies the resultant to an AD port of the microcomputer 7. That is, the half-wave rectifying and integrating circuit 6 functions as a low-pass filter as well.

Figure 2:
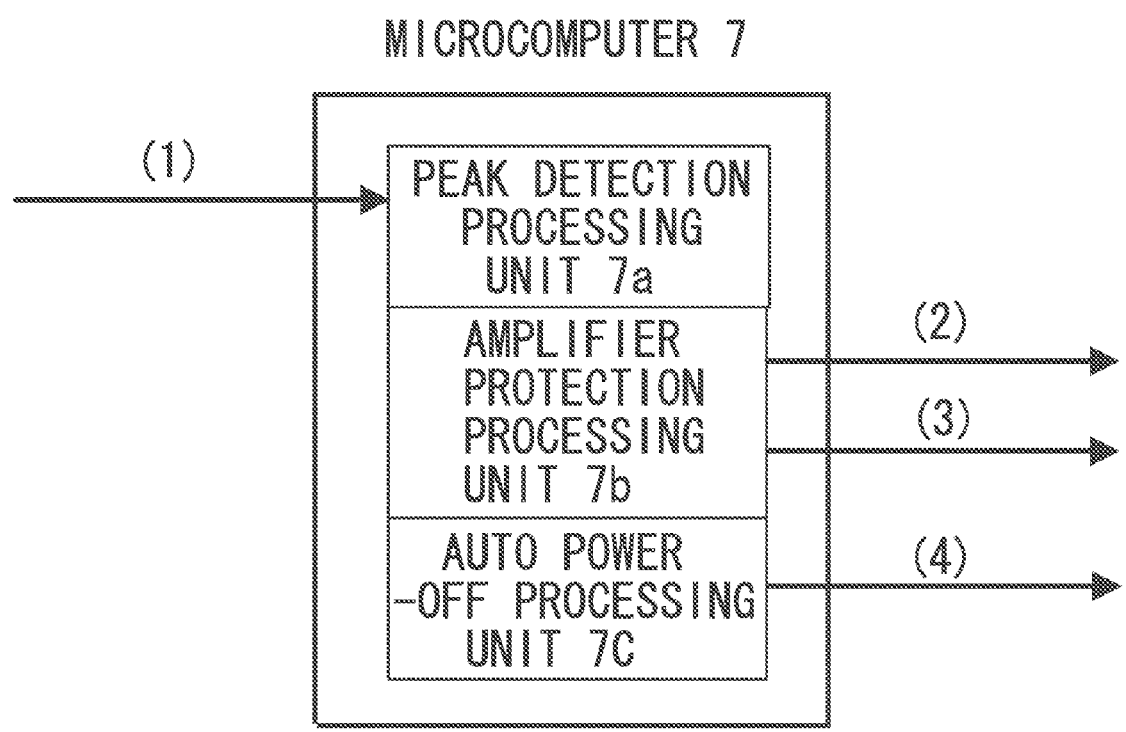
FIG. 2 is a functional block diagram showing a microcomputer 7 of the AV amplifier 1.

The microcomputer 7 AD (analog-digital)-converts the audio signal supplied to the AD port from the half-wave rectifying and integrating circuit 6 to generate a digital value of the audio signal. FIG. 2 is a functional block diagram of the microcomputer 7. The microcomputer 7 includes a peak detection processing unit 7a, an amplifier protection processing unit 7b, and an auto power-off processing unit 7c as functions thereof.

The peak detection processing unit 7a finds a peak value of the digital value of the audio signal in a predetermined time period (e.g., 5 seconds). That is, to the peak detection processing unit 7a is inputted the digital value of the audio signal at a time interval (e.g., 10 milliseconds) sufficiently shorter than the above-described predetermined time period (e.g., 5 seconds) ((1) in FIGS. 1, 2) to be compared with a peak value until the last time. If the digital value is larger than the peak value until the last time, the peak value is updated to the digital value of the audio signal inputted this time. If the digital value is smaller than the peak value until the last time, the peak value is not updated.

The amplifier protection processing unit 7b monitors the peak value found by the peak detection processing unit 7a, and when a state where the peak value is a first reference value or larger lasts in a predetermined time period or more (or as soon as the peak value becomes the first reference value or larger), the amplifier protection processing unit 7b supplies the amplifier power-supply circuit 8 with an instruction to shut off a power-supply voltage supplied to the power amplifier 4 or an instruction to switch the power-supply voltage supplied to the power amplifier 4 from a high voltage to a low voltage ((2) in FIGS. 1, 2).

Moreover, when a state where the peak value is a second reference value (which may be the same as, or different from the first reference value) or larger lasts in a predetermined time period or more (or as soon as the peak value becomes the second reference value or larger), the amplifier protection processing unit 7b supplies the fan driving circuit 10 with an instruction to switch the fan 9 from a stopped state to a driven state or an instruction to change a rotating speed of the fan 9 from a low speed to a high speed ((3) in FIGS. 1, 2).

The amplifier power-supply circuit 8, in accordance with the instruction (2) from the microcomputer 7, switches a state where the power-supply voltage is supplied to the power amplifier circuit 4 to a state where the power-supply voltage is not supplied to the power amplifier circuit 4. Alternatively, the amplifier power-supply circuit 8, in accordance with the instruction (2) from the microcomputer 7, switches the power-supply voltage supplied to the power amplifier circuit 4 from a high voltage to a low voltage. That is, when the state where a signal level of the output audio signal from the power amplifier circuit 4 is high lasts in the predetermined time period or more, and as a result, the digital value of the audio signal from the half-wave rectifying and integrating circuit 6 is the first reference value or larger lasts in the predetermined time period and more, the amplifier power-supply circuit 8 stops the supply of the power-supply voltage to the power amplifier circuit 4. Alternatively, the power-supply voltage supplied to the power amplifier circuit 4 is switched to the low voltage to prevent damage of the power amplifier circuit 4.

The fan driving circuit 10 switches the fan 9 from the stopped state to the driven state in accordance with the instruction (3) from the microcomputer 7. Alternatively, the fan driving circuit 10 causes the rotating speed of the fan 9 to be switched from the low speed to the high speed in accordance with the instruction (3) from the microcomputer 7. That is, when the state where the signal level of the output audio signal from the power amplifier circuit 4 is high lasts in the predetermined time period or more, and as a result, the state where the digital value of the audio signal from the half-wave rectifying and integrating circuit 6 is the second reference value or larger lasts in the predetermined time period or more, the fan driving circuit 10 switches the fan 9 from the stopped state to the driven state, or switches the rotating speed of the fan 9 from the low speed to the high speed to prevent the damage of the power amplifier circuit 4.

As the amplifier protecting circuit, only any one of the amplifier power-supply circuit 8, and the fan 9 and the fan driving circuit 10 may be provided.

The half-wave rectifying and integrating circuit 6, the microcomputer 7 and the power-supply circuit 11 make up an auto power-off circuit. The auto power-off circuit automatically shifts a power-supply state of the AV amplifier 1 from a power-on state to a power-off state when a silent state (a state where the audio signal is not inputted to the audio input terminal 2) lasts in a predetermined time or more. Thereby, even when a user forgets power-off, the silence when the AV amplifier 1 is not in use is determined, by which the power consumption can be reduced to save electricity. While the power-off state is not particularly limited, in this example, it is a standby state where the power-supply voltage is supplied only to the microcomputer 7 and peripheral circuits thereof without being supplied to the other circuits (the power-off state may be a complete power-off state where the power-supply voltage to the microcomputer 7 is also stopped, a sleep state or a hibernation state).

The auto power-off circuit detects the signal level of the output audio signal from the power amplifier circuit 4, and when a state where the output audio signal from the power amplifier circuit 4 is lower than the silence determination reference value lasts in the predetermined time period or more, the auto power-off circuit determines that the AV amplifier 1 is in the silent state and shifts the AV amplifier 1 from the power-on state to the standby state. In the case where a detection circuit that detects the signal level of the audio signal is provided between the audio input terminal 2 and the power amplifier circuit 4 (particularly, the volume adjustment circuit 3), the detection circuit needs to be provided for each of the audio input terminals, when the AV amplifier 1 includes the plurality of audio input terminals 2. In the present example, however, since the detection circuit is provided on the output side of the power amplifier circuit 4, the one detection circuit suffices, and the detection circuit does not need to be provided for each of the audio input terminals, which can make the circuit size smaller.

The auto power-off circuit shares the detection circuit that detects the signal level of the output audio signal from the power amplifier circuit 4 (the half-wave rectifying and integrating circuit 6 and the peak detection processing unit 7a) with the amplifier protecting circuit. Accordingly, in the case where the amplifier protecting circuit is included, the detection circuit that detects the signal level of the audio signal does not need to be provided separately for the auto power-off circuit, which can make the circuit size smaller. A reason why the detection circuit that detects the signal level of the audio signal can be shared between the amplifier protecting circuit and the auto power-off circuit is that the auto power-off circuit does not detect the signal level of the auto signal inputted to the power amplifier circuit 4 but detects the signal level of the output audio signal outputted from the power amplifier circuit 4.

The auto power-off processing unit 7c of the microcomputer 7 monitors the peak value found by the peak detection processing unit 7a, and when a state where the peak value is smaller than the silence determination reference value lasts in a predetermined time period (e.g., 30 minutes, one hour or the like) or more, an instruction to shift the power-supply state of the AV amplifier 1 from the power-on state to the standby state ((4) in FIGS. 1, 2) is supplied to the power-supply circuit 11.

The power-supply circuit 11, in accordance with the instruction (4) from the microcomputer 7, shifts the power-supply state of the AV amplifier 1 from the power-on state to the standby state. That is, when the state where the output audio signal from the power amplifier circuit 4 is silent lasts in the predetermined time period or more, and as a result, the state where the digital value of the audio signal from the half-wave rectifying and integrating circuit 6 is smaller than the silence determination reference value lasts in the predetermined time period or more, the AV amplifier 1 is automatically shifted from the power-on state to the standby state, by which electricity is saved when the AV amplifier 1 is not in use.

Figure 3:
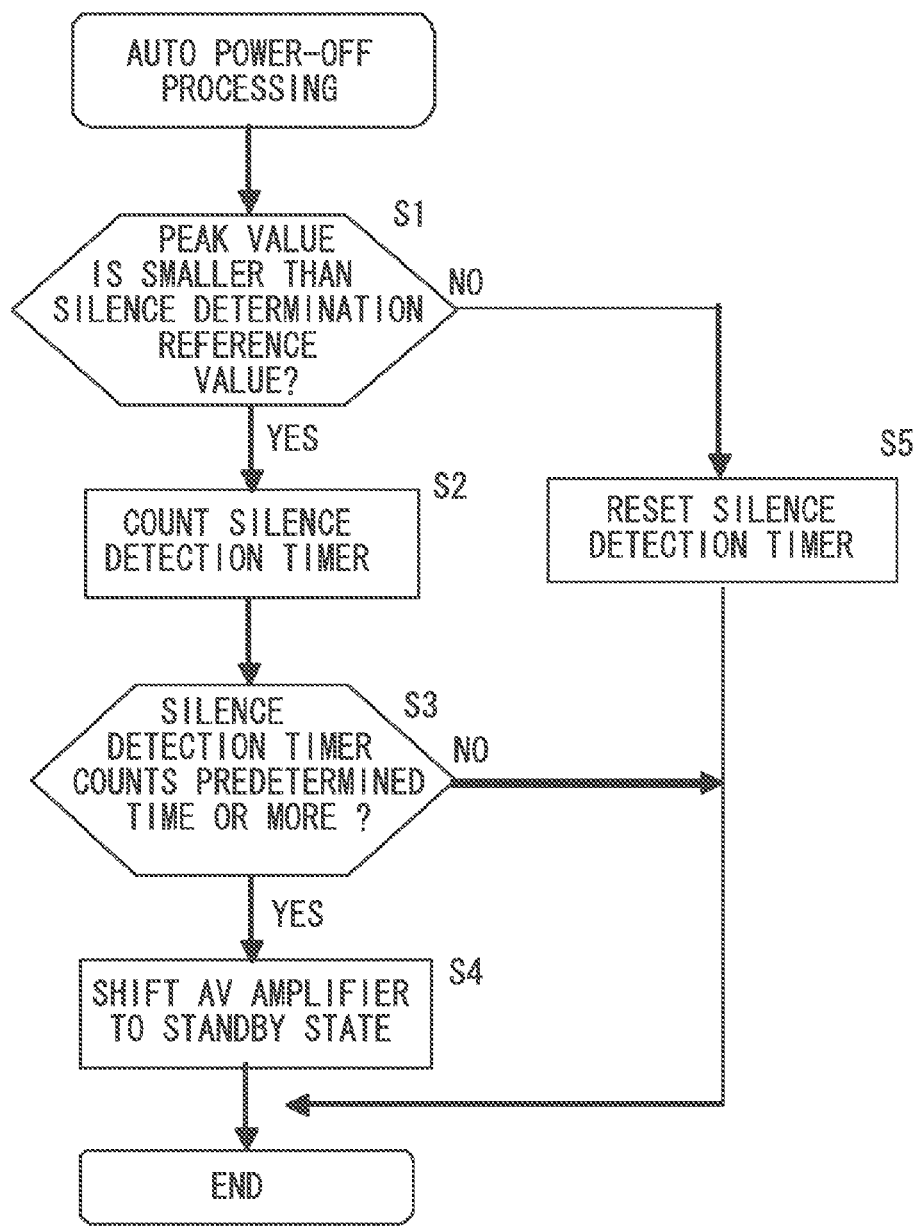
FIG. 3 is a flowchart showing processing of an auto power-off processing unit 7c.

FIG. 3 is a flowchart showing processing of the auto power-off processing unit 7c. The processing in FIG. 3 is continuously executed. The auto power-off processing unit 7c determines whether or not the peak value found by the peak detection processing unit 7a is smaller than the silence determination reference value (S1). If the peak value is smaller than the silence determination reference value (YES in S1), the auto power-off processing unit 7c counts a silence detection timer built into the microcomputer 7 (S2), and if the peak value is the silence determination reference value or larger (NO in S1), the auto power-off processing unit 7c resets the silence detection timer (S5).

The auto power-off processing unit 7c determines whether or not a count value of the silence detection timer has reached the predetermined time (S3), and if it has reached the predetermined time or more (YES in S3), the auto power-off processing unit 7c supplies the instruction (4) (e.g., a signal at a low level) to shift the AV amplifier 1 from the power-on state to the standby state to the power-supply circuit 11 (S4). As a result, the power-supply circuit 11 automatically shifts the AV amplifier 1 from the power-on state to the standby state.

Next, another preferred embodiment of the present invention is described. As in the AV amplifier 1 in FIG. 1, in the case where the signal level of the output audio signal from the power amplifier circuit 4 is detected to determine the silence, there arises the following problem. Even in the silent state, when a noise signal is inputted to the audio input terminal 2, a volume value of the noise signal is adjusted in the volume adjustment circuit 3, and the noise signal is amplified in the power amplifier circuit 4 to be outputted. Here, when the volume value of the volume adjustment circuit 4 is set large, a signal level of the noise signal outputted from the power amplifier circuit 4 becomes high. Accordingly, although the AV amplifier 1 is in the silent state, a digital value of the noise signal outputted from the power amplifier circuit 4 is determined to be the silence determination reference value or larger, which disables the auto power-off processing unit 7c to determine the silent state. If the silence determination reference value is set large, the digital value of the noise signal is not determined to be the silence determination reference value or large. However, if the volume value is set small, the signal level of the audio signal outputted from the power amplifier circuit 4 becomes small, which causes a possibility that the state is erroneously determined to be the silent state.

In order to solve this problem, in the present embodiment, the silence determination reference value is changed in conjunction with the volume value set in the volume adjustment circuit 3. That is, the larger the volume value is set in the volume adjustment circuit 3, the larger the silence determination reference value is also set. Thereby, even when the volume value is set large, so that the signal level of the noise signal is amplified to be high, the silence determination reference value is set large as well, which prevents the digital value of the noise signal from being the silence determination reference value or large. As a result, the silent state can be determined precisely. Moreover, when the volume value is set small, the silence determination reference value is also set small, which can prevent the silence from being erroneously determined when the signal level of the audio signal is low.

Figure 4:
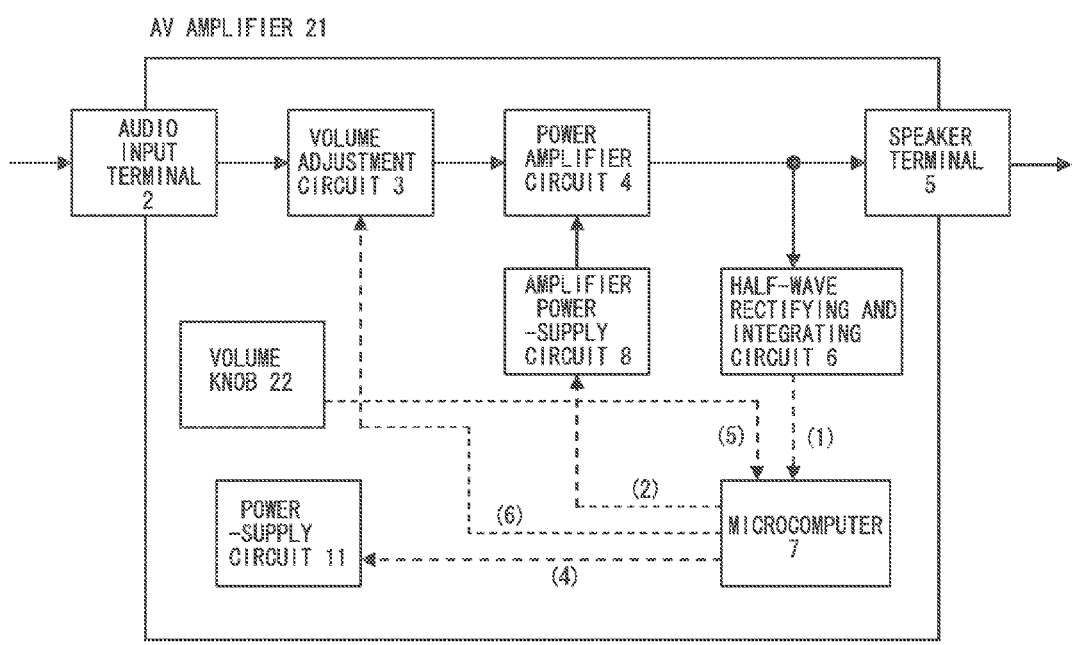
FIG. 4 is a block diagram showing an AV amplifier 21 according to a preferred embodiment of the present invention.
Figure 5:
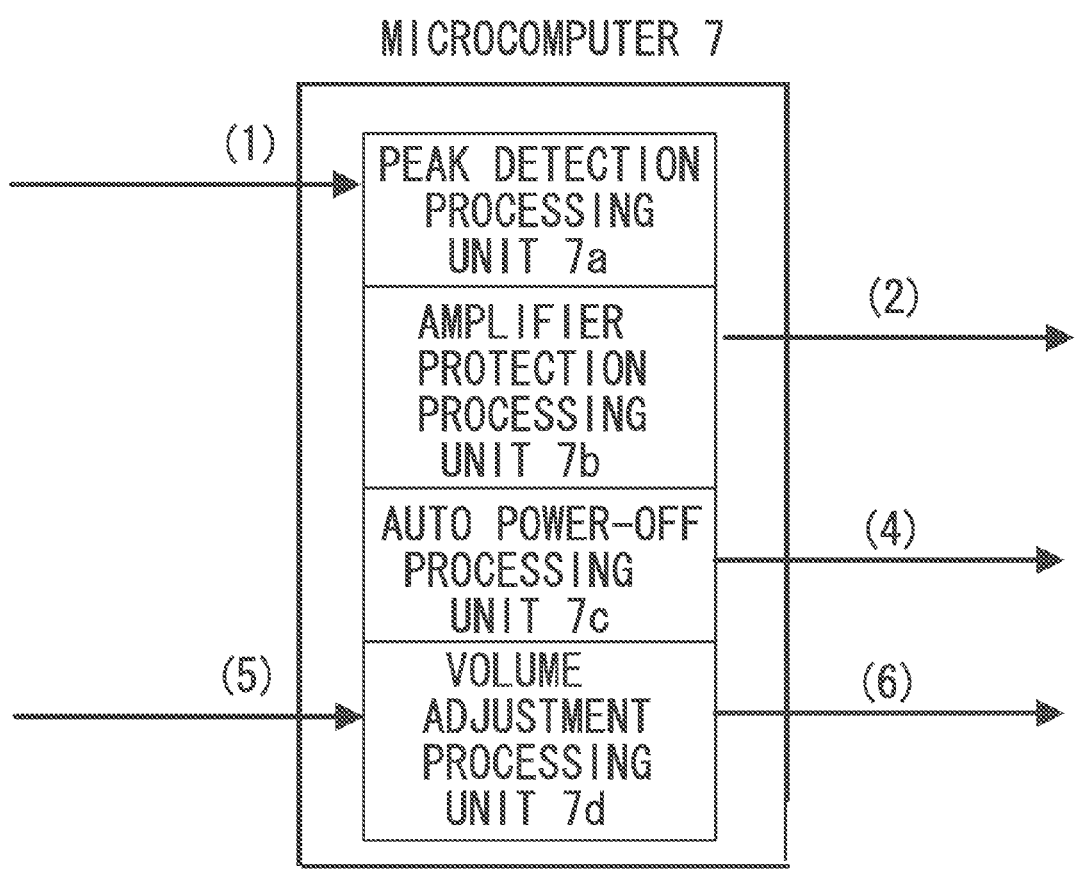
FIG. 5 is a functional block diagram showing the microcomputer 7 of the AV amplifier 21.

FIG. 4 is a block diagram showing an AV amplifier 21 of the present embodiment. FIG. 5 is a functional block diagram showing the microcomputer 7 of the present embodiment. When a volume knob 22 is operated by user operation so as to turn, information of a turn position of the volume knob 22 is supplied to a volume adjustment processing unit 7d of the microcomputer 7 ((5) in FIGS. 4, 5). The volume adjustment processing unit 7d decides the volume value based on the information of the turn position, and sets an amplification rate equivalent to the decided volume value for the volume adjustment circuit 3 ((6) in FIGS. 4, 5). The volume adjustment circuit 3 amplifies the audio signal and the noise signal at the set amplification rate.

The volume adjustment processing unit 7d supplies the decided volume value to the auto power-off processing unit 7c. Inside the microcomputer 7, a silence determination reference value table shown in FIG. 6 is stored in advance. In the silence determination reference value table, the silence determination reference value is registered in association with the volume value. As shown in FIG. 6, setting is made so that the larger the volume value becomes, the larger the silence determination reference value becomes.

Figure 7:
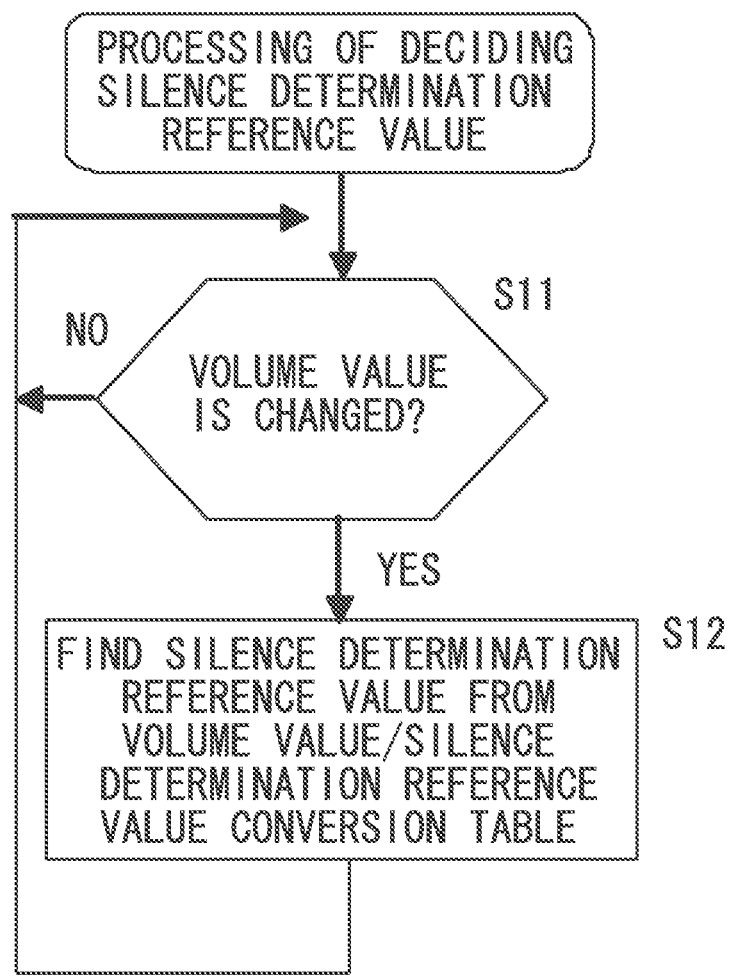
FIG. 7 is a flowchart showing processing of the auto power-off processing unit 7c.

The auto power-off processing unit 7c further executes processing in FIG. 7 in addition to the above-described processing in FIG. 3. As shown in FIG. 7, the auto power-off processing unit 7c determines whether or not the volume value is changed (S11), and when the volume value is changed (YES in S11), the auto power-off processing unit 7c reads the silence determination reference value corresponding to the changed volume value from the silence determination reference value table to set the silence determination reference value (S12). For example, when the volume value is set to 4, the silence determination reference value is set to 0.0003. As described above, according to the present embodiment, as the volume value becomes larger, the silence determination reference value is also set larger, and thus, even when the signal level of the noise signal is amplified to be high in the silent state, the signal level of the noise signal does not become the silence determination reference value or higher, and as a result, the silence can be detected precisely.

Next, still another preferred embodiment of the present invention is described. In the present embodiment, in the AV amplifier in FIGS. 1, 4, the amplifier protecting circuit is not provided, and only the auto power-off circuit is provided. That is, the amplifier power-supply circuit 8, the fan 9, the fan driving circuit 10 and the amplifier protection processing unit 7b are omitted. Alternatively, although the amplifier protecting circuit is provided, the detection circuit (the half-wave rectifying and integrating circuit 6 and the peak detection processing unit 7a) is not shared between the amplifier protecting circuit and the auto power-off circuit.

Next, still another preferred embodiment of the present invention is described. In the case of the audio signals of a plurality of channels (e.g., 5 channels of front-left, front-right, center, surround-left, and surround-right), when it is determined that the audio signals of all the channels have been continuously silent in a predetermined time period, the AV amplifier needs to be automatically shifted from the power-on state from the standby state. Accordingly, the detection circuit made up of the half-wave rectifying and integrating circuit 6, the peak detection processing unit 7a and the like needs to be provided for each of the channels.

Consequently, the audio signals of the respective channels outputted from the power amplifier 4 are synthesized, and when a state where the synthesized signal is lower than the reference determination reference value lasts in the predetermined time period or more, it is determined that the audio signals of all the channels have been continuously silent in the predetermined time period to shift the AV amplifier from the power-on state to the standby state. This can make it unnecessary to provide the half-wave rectifying and integrating circuit 6 and the peak detection processing unit 7a for the audio signal of each of the channels, thereby reducing the circuit size. Moreover, the processing of the auto power-off processing unit 7c in FIG. 3 does not need to be executed for the audio signal of each of the channels, which can reduce load of the microcomputer 7. The reason why the processing can be performed in this manner is that the signal levels of the input audio signals of the power amplifier circuit 4 are not detected, but the signal levels of the output audio signals of the power amplifier circuit 4 are detected.

Figure 8:
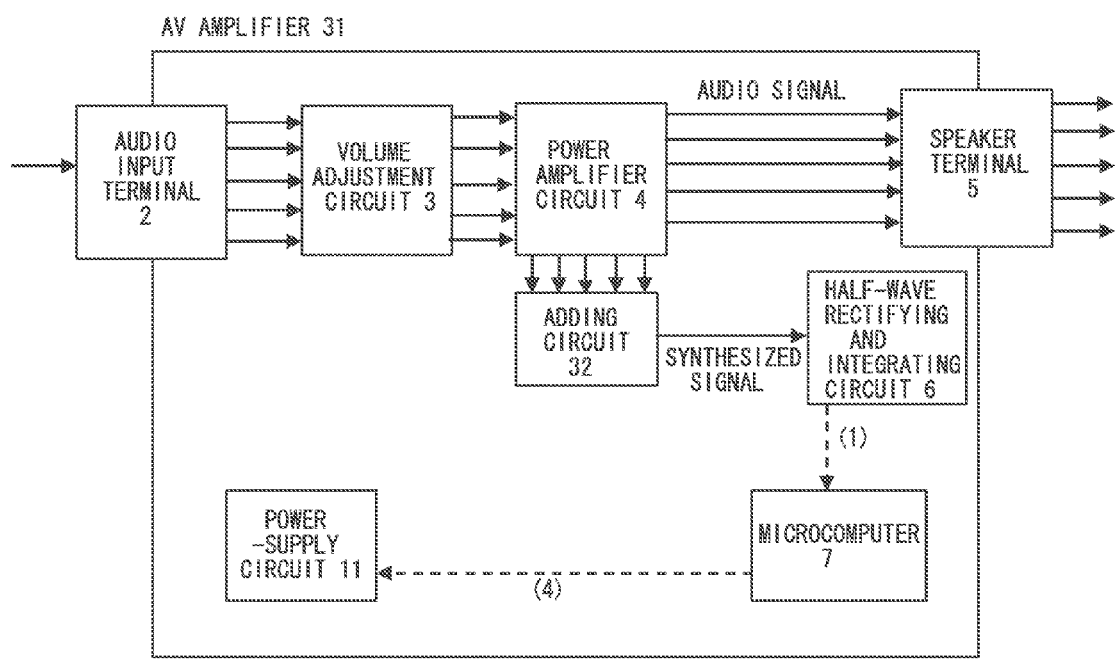
FIG. 8 is a block diagram showing an AV amplifier 31 according to a preferred embodiment of the present invention.

FIG. 8 is a block diagram showing an AV amplifier 31 of the present embodiment. The audio signals of the 5 channels from the power amplifier circuit 4 are synthesized in an adding circuit 32, and the synthesized signal is supplied to the half-wave rectifying and integrating circuit 6.

Figure 9:
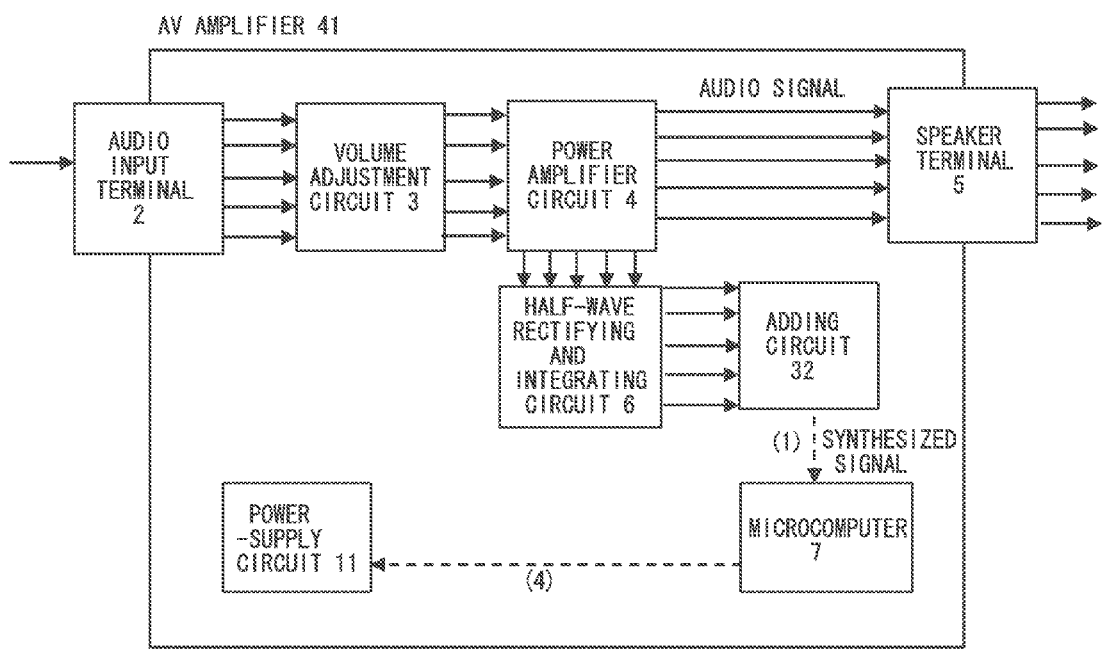
FIG. 9 is a block diagram showing an AV amplifier 41 according to a preferred embodiment of the present invention.

FIG. 9 shows an AV amplifier 41 according to still another embodiment of the present invention, and as compared with the AV amplifier 31 in FIG. 8, the adding circuit 32 is provided at the following stage of the half-wave rectifying and integrating circuit 6. The audio signals of the 5 channels from the half-wave rectifying and integrating circuit 6 are synthesized in the adding circuit 32, and the synthesized signal is supplied to the microcomputer 7.

Next, still another preferred embodiment of the present invention is described. In the above-described embodiments, when it is determined in the microcomputer 7 that the audio signal from the half-wave rectifying and integrating circuit 6 has been continuously lower than the silence determination reference value in the predetermined time period or more, the AV amplifier is put into the standby state. However, as soon as the audio signal from the half-wave rectifying and integrating circuit 6 becomes lower than the silence determination reference value, the AV amplifier may be put into the standby state.

Figure 10:
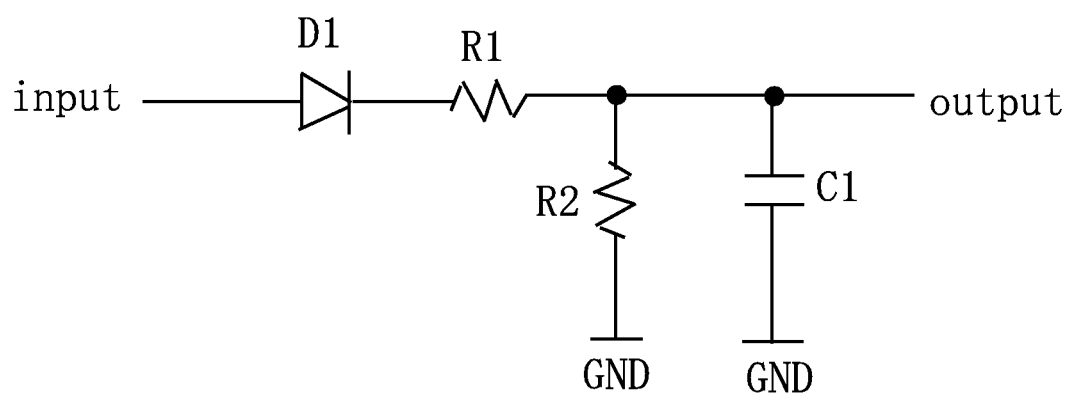
FIG. 10 is a circuit diagram showing a half-wave rectifying and integrating circuit.
Figure 11:
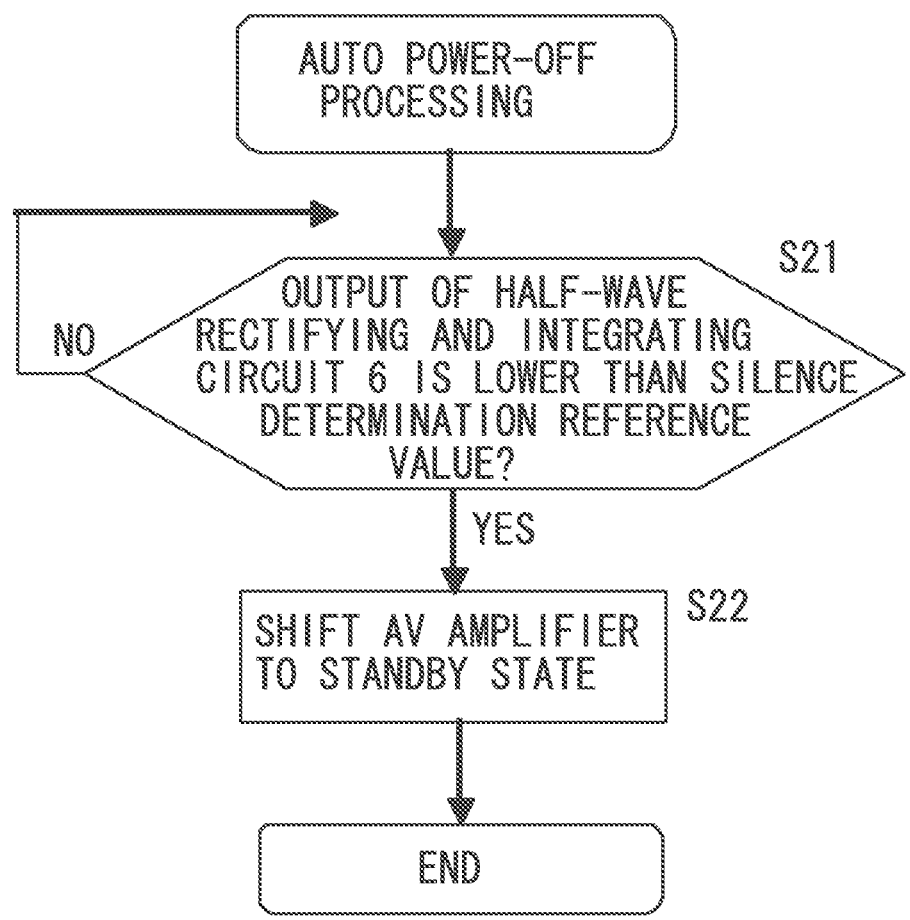
FIG. 11 is a flowchart showing processing of the auto power-off processing unit 7c.

FIG. 10 is a circuit diagram showing one example of the half-wave rectifying and integrating circuit 6. Here, a value between a resistor R2 and a capacitor C1 is made large to set a time constant large. Thereby, it is not until the state where the audio signal from the power amplifier circuit 4 is lower than the silence determination reference value has lasted in the predetermined time period or more that the audio signal from the half-wave rectifying and integrating circuit 6 becomes lower than the silence determination reference value. In other words, before the state where the audio signal from the power amplifier circuit 4 is lower than the silence determination reference value has lasted in the predetermined time period or more, the audio signal from the half-wave rectifying and integrating circuit 6 does not become lower than the silence determination reference value. Accordingly, in the microcomputer 7, as shown in FIG. 11, it is simply determined whether or not the audio signal from the half-wave rectifying and integrating circuit 6 is lower than the silence determination reference value, and if it is lower than the silence determination reference value, the AV amplifier may be put into the standby state.

While in the foregoing, the preferred embodiments of the present invention have been described, the present invention is not limited to these embodiments.

What is claimed is:

1. An amplification apparatus comprising:
   an amplifier circuit that amplifies an input audio signal and outputs an output audio signal;
   a first signal level determining unit that determines whether or not a signal level of the output audio signal outputted from the amplifier circuit is lower than a silence determination reference value;
   a power-supply control unit that shifts the amplification apparatus from a power-on state to a power-off state, when it is determined that the signal level of the output audio signal outputted from the amplifier circuit is lower than the silence determination reference value;
   a volume adjusting unit that adjusts a signal level of the input audio signal in accordance with a set volume value to supply to the amplifier circuit;
   a volume value setting unit that sets the volume value of the volume adjusting unit in accordance with a user operation;
   a silence determination reference value managing unit that manages the volume value and the silence determination reference value in advance while associating them with each other; and
   a silence determination reference value deciding unit that reads the silence determination reference value corresponding to the volume value set by the volume value setting unit from the silence determination reference value managing unit to decide as the silence determination reference value.

2. The amplification apparatus according to claim 1, further comprising:
   a second signal level determining unit that determines whether or not the signal level of the output audio signal outputted from the amplifier circuit is an amplifier protection reference value or higher; and
   an amplifier protecting unit that executes processing for protecting the amplifier circuit, when it is determined that the signal level of the output audio signal outputted from the amplifier circuit is the amplifier protection reference value or higher.

3. The amplification apparatus according to claim 1, wherein
   the first signal level determining unit determines whether or not a state where the signal level of the output audio signal outputted from the amplifier circuit is lower than the silence determination reference value has lasted in a predetermined time period or more, and
   when it is determined that the state where the signal level of the output audio signal outputted from the amplifier circuit is lower than the silence determination reference value has lasted in the predetermined time period or more, the power-supply control unit shifts the amplification apparatus from the power-on state to the power-off state.

4. An amplification apparatus comprising:
   an amplifier circuit that amplifies an input audio signal and outputs an output audio signal;
   a first signal level determining unit that determines whether or not a signal level of the output audio signal outputted from the amplifier circuit is lower than a silence determination reference value;
   a power-supply control unit that shifts the amplification apparatus from a power-on state to a power-off state, when it is determined that the signal level of the output audio signal outputted from the amplifier circuit is lower than the silence determination reference value;
   a volume adjusting unit that adjusts a signal level of the input audio signal in accordance with a set volume value to supply to the amplifier circuit;
   a volume value setting unit that sets the volume value of the volume adjusting unit in accordance with a user operation;
   a silence determination reference value managing unit that manages the volume value and the silence determination reference value in advance while associating them with each other; and
   a silence determination reference value deciding unit that reads the silence determination reference value corresponding to the volume value set by the volume value setting unit from the silence determination reference value managing unit to decide as the silence determination reference value,
   wherein the silence determination reference value managing unit manages the volume value and the silence determination reference value while associating them with each other so that as the volume value becomes larger, the silence determination reference value becomes larger.

5. The amplification apparatus according to claim 1, wherein
   the input audio signal includes input audio signals of a plurality of channels,
   the first signal level determining unit determines whether or not a signal level of a synthesized signal of output audio signals of the plurality of channels outputted from the amplifier circuit is lower than the silence determination reference value, and
   when it is determined that the signal level of the synthesized signal of the output audio signals of the plurality of channels outputted from the amplifier circuit is lower than the silence determination reference value, the power-supply control unit shifts the amplification apparatus from the power-on state to the power-off state.

6. The amplification apparatus according to claim 4, wherein
   the first signal level determining unit determines whether or not a state where the signal level of the output audio signal outputted from the amplifier circuit is lower than the silence determination reference value has lasted in a predetermined time period or more, and
   when it is determined that the state where the signal level of the output audio signal outputted from the amplifier circuit is lower than the silence determination reference value has lasted in the predetermined time period or more, the power-supply control unit shifts the amplification apparatus from the power-on state to the power-off state.

7. The amplification apparatus according to claim 4, further comprising:
   a second signal level determining unit that determines whether or not the signal level of the output audio signal outputted from the amplifier circuit is an amplifier protection reference value or higher; and an amplifier protecting unit that executes processing for protecting the amplifier circuit, when it is determined that the signal level of the output audio signal outputted from the amplifier circuit is the amplifier protection reference value or higher.

8. The amplification apparatus according to claim 4, wherein the input audio signal includes input audio signals of a plurality of channels, the first signal level determining unit determines whether or not a signal level of a synthesized signal of output audio signals of the plurality of channels outputted from the amplifier circuit is lower than the silence determination reference value, and when it is determined that the signal level of the synthesized signal of the output audio signals of the plurality of channels outputted from the amplifier circuit is lower than the silence determination reference value, the power-supply control unit shifts the amplification apparatus from the power-on state to the power-off state.

* * * * *